(12) United States Patent
Zhang et al.

(10) Patent No.: US 9,799,564 B2
(45) Date of Patent: Oct. 24, 2017

(54) SEMICONDUCTOR STRUCTURE HAVING CONTACT HOLES BETWEEN SIDEWALL SPACERS AND FABRICATION METHOD THERE OF

(71) Applicant: Semiconductor Manufacturing International (Shanghai) Corporation, Shanghai (CN)

(72) Inventors: Chenglong Zhang, Shanghai (CN); Haiyang Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 1 day.

(21) Appl. No.: 15/059,635

(22) Filed: Mar. 3, 2016

(65) Prior Publication Data

US 2016/0276283 A1 Sep. 22, 2016

(30) Foreign Application Priority Data

Mar. 20, 2015 (CN) .......................... 2015 1 0125779

(51) Int. Cl.
*H01L 27/088* (2006.01)
*H01L 21/8234* (2006.01)
*H01L 21/311* (2006.01)
*H01L 21/768* (2006.01)
*H01L 29/51* (2006.01)
(Continued)

(52) U.S. Cl.
CPC ................ *H01L 21/823431* (2013.01); *H01L 21/31144* (2013.01); *H01L 21/76829* (2013.01); *H01L 21/76897* (2013.01); *H01L 21/823462* (2013.01); *H01L 21/823468* (2013.01); *H01L 21/823475* (2013.01); *H01L 27/0886* (2013.01); *H01L 29/495* (2013.01); *H01L 29/4966* (2013.01); *H01L 29/517* (2013.01); *H01L 29/66795* (2013.01); *H01L 29/785* (2013.01)

(58) Field of Classification Search
CPC ....... H01L 21/823431; H01L 21/76897; H01L 29/495; H01L 29/66795; H01L 21/76829; H01L 27/0886; H01L 21/823475; H01L 21/823468; H01L 29/785
See application file for complete search history.

(56) References Cited

U.S. PATENT DOCUMENTS

2014/0327076 A1* 11/2014 Jagannathan ........... H01L 29/49
  257/347
2015/0035088 A1* 2/2015 Hong .................... H01L 29/401
  257/411

\* cited by examiner

*Primary Examiner* — Thanh Y Tran
(74) *Attorney, Agent, or Firm* — Anova Law Group, PLLC

(57) ABSTRACT

The disclosed subject matter provides a semiconductor structure and fabrication method thereof. In a semiconductor structure, a dielectric layer, a plurality of discrete gate structures, and a plurality of sidewall spacers are formed on a semiconductor substrate. The plurality of discrete gate structures and sidewall spacers are formed in the dielectric layer, and a sidewall spacer is formed on each side of each gate structure. A top portion of each gate structure and a top portion of the dielectric layer between neighboring sidewall spacers of neighboring gate structures are removed. A protective layer is formed on each of the remaining dielectric layer and the remaining gate structures. Contact holes are formed on the semiconductor substrate, between neighboring sidewall spacers, and on opposite sides of the protective layer on the remaining dielectric layer. A metal plug is formed in each contact hole.

17 Claims, 11 Drawing Sheets

(51) Int. Cl.
*H01L 29/49* (2006.01)
*H01L 29/66* (2006.01)
*H01L 29/78* (2006.01)

SEMICONDUCTOR STRUCTURE HAVING CONTACT HOLES BETWEEN SIDEWALL SPACERS AND FABRICATION METHOD THERE OF

CROSS-REFERENCES TO RELATED APPLICATIONS

This application claims the priority of Chinese Patent Application No. CN201510125779.4, filed on Mar. 20, 2015, the entire content of which is incorporated herein by reference.

FIELD OF THE DISCLOSURE

The present disclosure generally relates to the field of semiconductor fabrication technology and, more particularly, relates to a semiconductor structure and fabrication methods thereof.

BACKGROUND

With continuous development of semiconductor technology, progress has been made on many aspects. For example, high-k dielectric layer has been introduced, while stress engineering technology, pocket ion implantation, as well as materials and device structures have also been steadily optimized. As a result, the size of semiconductor devices becomes smaller and smaller. However, when the feature size (or critical dimension, CD) of devices further decreases, traditional planar transistors face great challenges because short channel effect may become more prominent, fabrication process may vary, and reliability may be decreased.

As compared to planar transistors, fin type field effect transistors (fin-FETs) have fully depleted fins, lower fluctuations in the concentration of doped ions, higher carrier mobility, lower parasitic capacitances, and higher area using efficiency. Therefore, fin-FETs have attracted much attention.

During a fabrication process for integrated circuits (ICs), a plurality of metallic layers may be required to connect semiconductor devices together to form electric circuit after the formation of semiconductor device structures on a substrate. The metallic layers may include interconnecting wires and metal plugs formed in contact holes. Specifically, each metal plug formed in a corresponding contact hole may be used to connect semiconductor devices, while interconnecting wires may be used to connect the metal plugs, connecting to different semiconductor devices, together to form electric circuits. The contact holes formed in transistors include contact holes on surfaces of gate electrodes and contact holes connecting to active regions. As process nodes in ICs continue to shrink, the distance between neighboring gate electrodes also gradually decreases. Contact holes on surfaces of active regions between neighboring gate electrodes may not be able to be directly formed by a photolithography and etching process. Instead, a self-alignment process is usually adopted to form such contact holes to connect to the active regions.

However, the size of contact holes in semiconductor structures formed by an existing self-alignment method may deviate from the designed value. The connection performance of the formed metal plugs may be affected and the performance of the formed semiconductor structure may also be affected.

The disclosed fabrication method and semiconductor structure are directed to solve one or more problems set forth above and other problems in the art.

BRIEF SUMMARY OF THE DISCLOSURE

One aspect of the present disclosure includes a method for fabricating a semiconductor structure. The method includes forming a dielectric layer, a plurality of discrete gate structures, and a plurality of sidewall spacers on a semiconductor substrate. Specifically, the plurality of discrete gate structures and the sidewall spacers are formed in the dielectric layer, and one sidewall spacer is formed on each side of each gate structure. The method also includes removing a top portion of each gate structure and a top portion of the dielectric layer between neighboring sidewall spacers of neighboring gate structures. The top portion of the dielectric layer is located corresponding to a portion of a length of the neighboring sidewall spacers. The method further includes forming a protective layer on each of the remaining dielectric layer and the remaining gate structures. After forming the protective layer, the method includes forming contact holes on the semiconductor substrate, between neighboring sidewall spacers, and on opposite sides of the protective layer on the remaining dielectric layer and forming a metal plug in each contact hole.

Another aspect of the present disclosure provides a semiconductor structure. The semiconductor structure includes a dielectric layer, a plurality of discrete gate structures, and a plurality of sidewall spacers disposed on a semiconductor substrate. The plurality of discrete gate structures and the sidewall spaces are disposed in the dielectric layer, and one sidewall spacer is formed on each side of each gate structure. The semiconductor structure further includes a first protective layer formed on a surface portion of the dielectric layer between neighboring sidewall spacers of neighboring gate structures. The first protective layer is located corresponding to a portion of a length of the neighboring sidewall spacers. The semiconductor structure also includes a second protective layer formed on each gate structure, contact holes formed on the semiconductor substrate, between neighboring sidewall spacers, and on opposite sides of the first protective layer, and metal plugs with each formed in a corresponding contact hole.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-11 show schematic views of semiconductor structures corresponding to certain stages of an exemplary fabrication method consistent with various disclosed embodiments technology.

Figure 1:
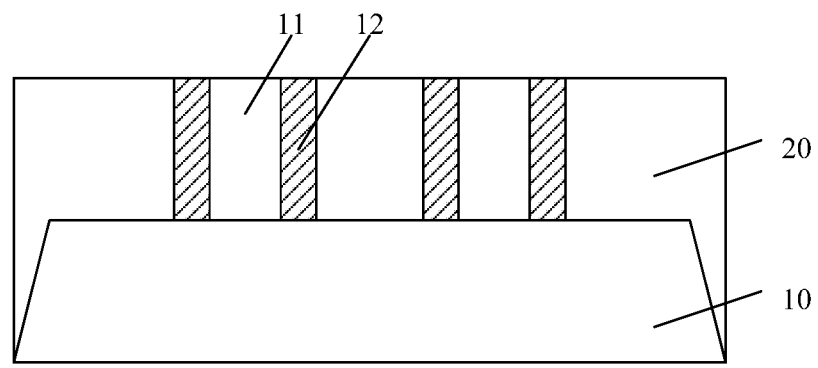
FIGS. 1-11 illustrate schematic views of semiconductor structures corresponding to certain stages of an exemplary fabrication method consistent with various disclosed embodiments.

At the beginning of the fabrication process, a semiconductor substrate 10 may be provided. FIG. 1 shows a schematic cross-section view of the semiconductor substrate 10.

Referring to FIG. 1, a plurality of gate structures 11 may be formed on the top of the semiconductor substrate 10. The gate structures 11 may have sidewall spacers 12 formed on the side surfaces of the gate structures 11. A first dielectric layer 20 may also be formed on the semiconductor substrate 10. The surface of the first dielectric layer 20 may be leveled with the surface of the gate structures 11. Each gate structure 11 may further include a gate dielectric layer (not shown) and a gate electrode formed on the surface of the gate dielectric layer. The semiconductor substrate 10 may include a base substrate (not shown) and a plurality of fin structures formed on the surface of the base substrate. Moreover, each gate structure 11 may cross the fin structures and cover the side surfaces and the top surfaces of the fin structures. The cross-section view of the structure shown in FIG. 1 is along the long direction of a fin structure.

Figure 2:
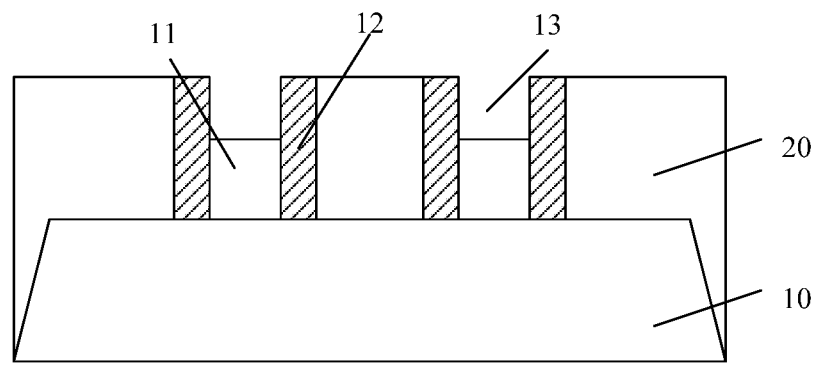

Further, a portion of each gate electrode may be removed by etching to form a trench 13 on the top of the gate structure 11. FIG. 2 shows a schematic cross section view of the corresponding structure.

Referring to FIG. 2, the height of each gate structure 11 may be reduced by etching. As a result, the trench 13 may then be formed on the top of the gate structure 11.

Figure 3:
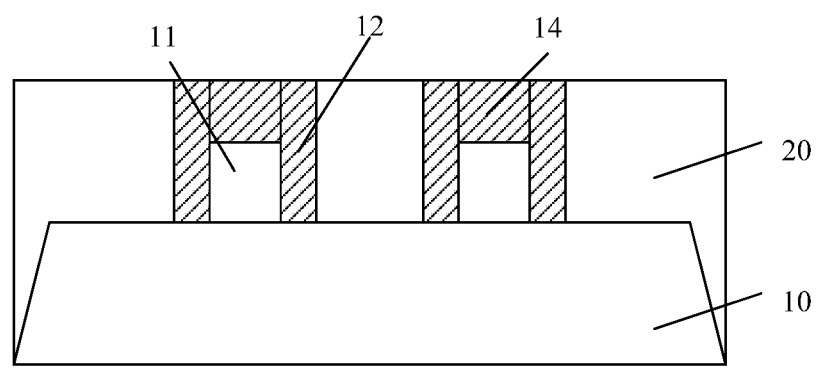

Further, a protective layer 14 may be formed in each trench 13 to cover the top of the corresponding gate structure 11. FIG. 3 shows a schematic cross-section view of the corresponding structure with a plurality of protective layers 14 formed on the top surfaces of the gate structures 11. The surfaces of the protective layers 14 may be leveled with the surface of the first dielectric layer 20. The protective layer 14 may be used to protect the gate structure 11 during a subsequent process to form a contact hole.

Figure 4:
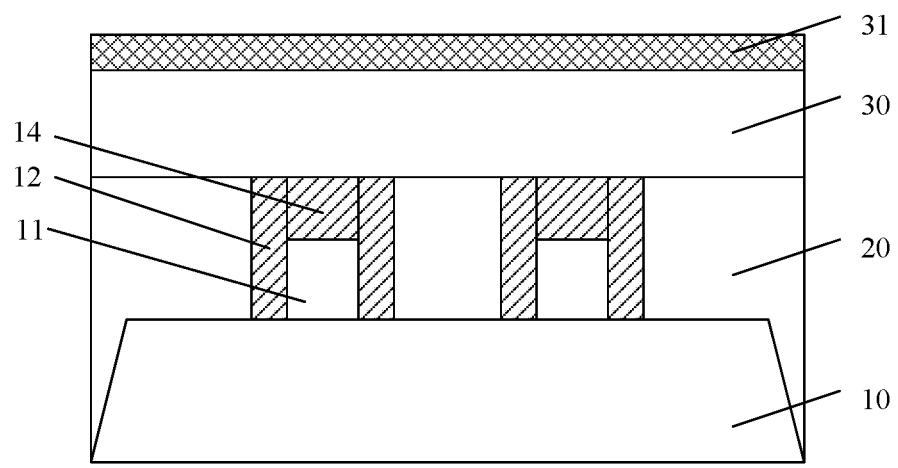

Further, a second dielectric layer 30 may be formed to cover the first dielectric layer 20, the sidewall spacers 12, and the protective layers 14. Then, a mask material layer 31 may be formed on the surface of the second dielectric layer 30. FIG. 4 shows a corresponding structure.

Referring to FIG. 4, the second dielectric layer 30 is formed on the top surfaces of the first dielectric layer 20, the sidewall spacers 12, and the protective layers 14. The mask material layer 31 is then formed to cover the second dielectric layer 30.

The mask material layer 31 may be used to form a mask layer in a subsequent process and the mask layer may then be used as an etch mask in an etching process to form contact holes. The mask material layer 31 may be made of a metal such as TiN.

Figure 5:
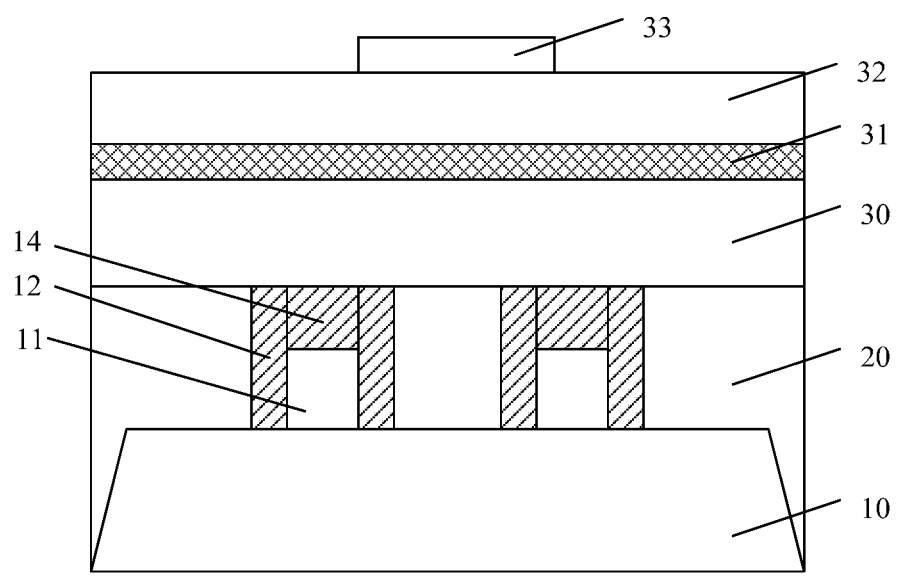

Further, a bottom anti-reflective coating 32 may be formed on the surface of the mask material layer 31 and a patterned photoresist layer 33 may then be formed on the surface of the bottom anti-reflective coating 32. FIG. 5 shows a corresponding structure.

Referring to FIG. 5, the bottom anti-reflective coating 32 is formed on the surface of the mask material layer 31 and then the patterned photoresist layer 33 is formed on the bottom anti-reflective coating 32. The pattern of the patterned photoresist layer 33 may correspond to a pattern of a mask layer subsequently formed from the mask material layer 31 by etching. The patterned photoresist layer 33 is located above a portion of the first dielectric layer 20 between two neighboring gate structures 11. The width of the patterned photoresist layer 33 may be greater than the distance between the two neighboring gate structures 11.

Figure 6:
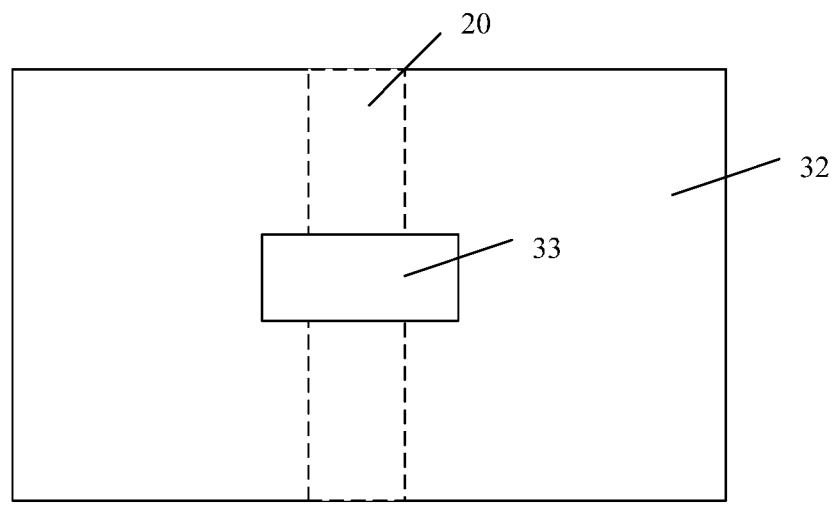

FIG. 6 shows a schematic top view of the semiconductor structure after the formation of the patterned photoresist layer 33. The dashed lines in FIG. 6 represent the edges of the portion of the first dielectric layer 20 between two neighboring gate structures. The patterned photoresist layer 33 is formed above the first dielectric layer 20 and across the two neighboring gate structures.

Figure 7:
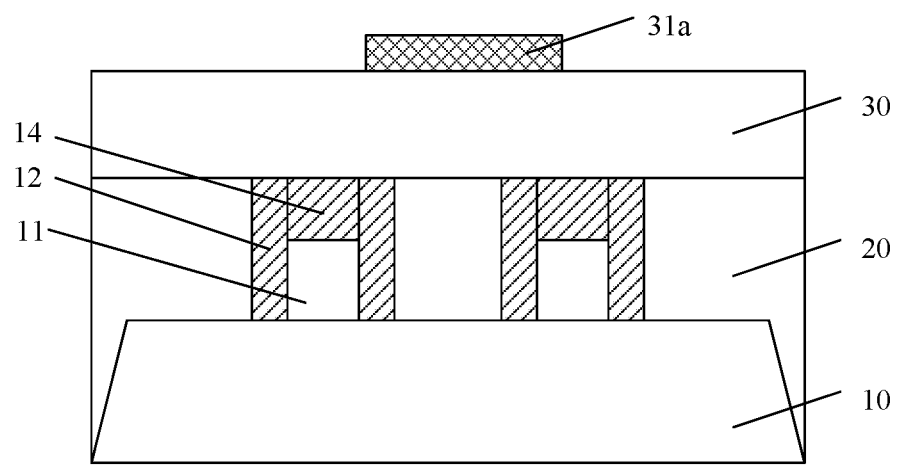

Further, a mask layer 31a may be formed from the mask material layer 31 through etching. FIG. 7 shows a corresponding structure.

Referring to FIG. 7, the mask layer 31a may be formed by etching the bottom anti-reflective coating 32 (referring to FIG. 5) and the mask material layer 31 (referring to FIG. 5). After the etching process, the bottom anti-reflective coating 32 and the patterned mask layer 33 may be removed.

Figure 8:
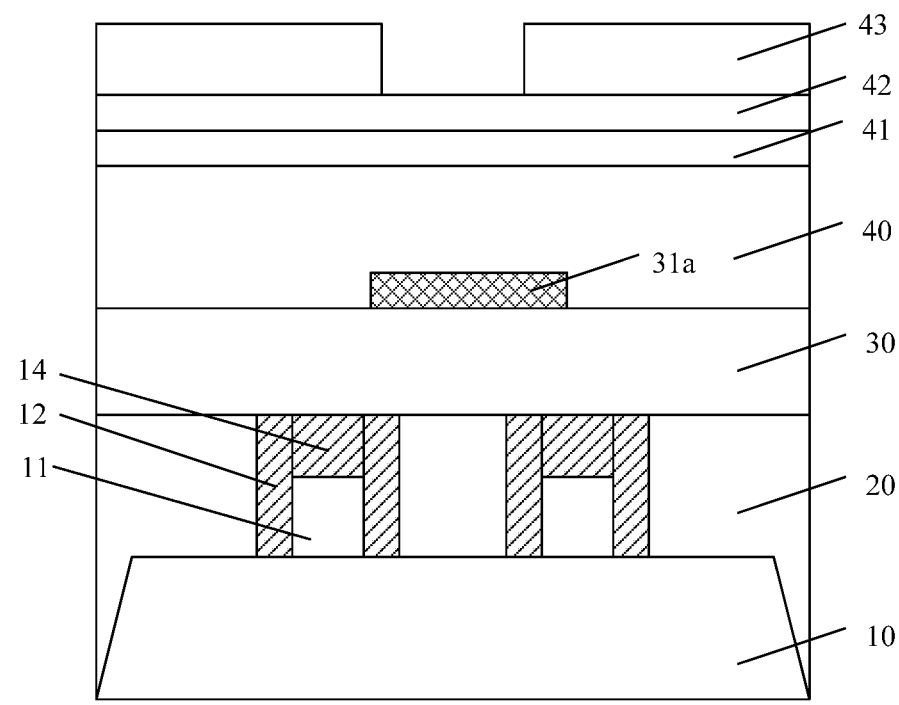

Further, an amorphous carbon layer 40, a low-temperature oxide layer 41, another bottom anti-reflective coating 42, and another photoresist layer 43 may be sequentially formed on the surface of the second dielectric layer 30. FIG. 8 shows a corresponding structure.

Referring to FIG. 8, the amorphous carbon layer 40 may be formed on the surface of the second dielectric layer 30. Then, the low-temperature oxide layer 41 may be formed to cover the surface of the amorphous carbon layer 40. Further, the bottom anti-reflective coating 42 may be formed on the surface of the low-temperature oxide layer 41. Finally, the photoresist layer 43 with an opening may be formed on the bottom anti-reflective coating 42. The opening in the photoresist layer 43 may be located above the first dielectric layer 20 between the two neighboring gate structures 11. The width of the opening is larger than the width of the first dielectric layer 20 between the two neighboring gate structures 11.

Figure 9:
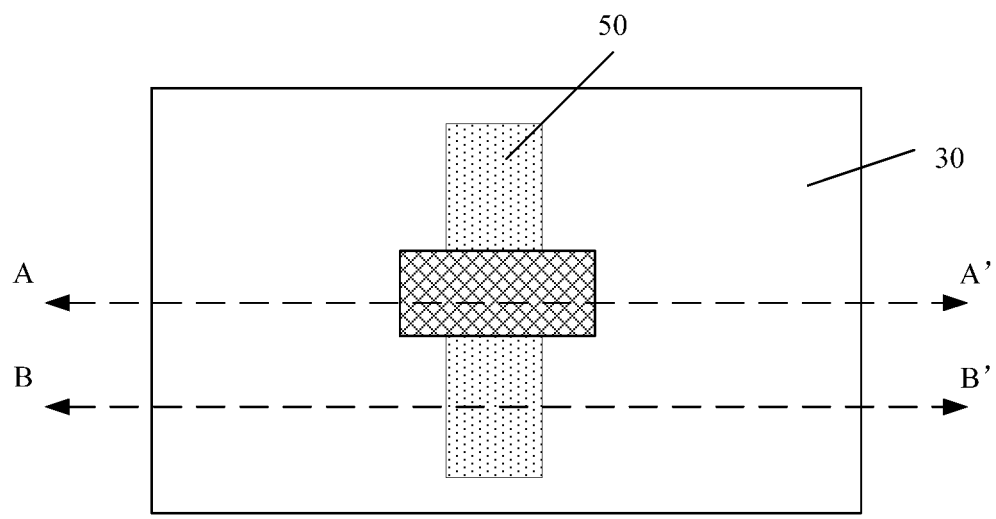

Further, contact holes may be formed by etching through the bottom anti-reflective coating 42, the low-temperature oxide layer 41, the amorphous carbon layer 40, the second dielectric layer 30, and the first dielectric layer 20 along the opening formed in the photoresist layer 43. The contact holes may be filled with a metal material in a subsequent process to form metal plugs. FIG. 9 shows a schematic top-view of a corresponding structure with the contact holes formed by etching and then filled with a metal material.

Referring to FIG. 9, the bottom anti-reflective coating 42, the low-temperature oxide layer 41, and the amorphous carbon layer 40 may be etched along the opening formed in the photoresist layer 43 so that the pattern of the opening may be transferred into the amorphous carbon layer 40. Then, contact holes may be formed by further etching the second dielectric layer 30 and the first dielectric layer 20 using the amorphous carbon layer 40 and the mask layer 31a as etch masks until the surface of the semiconductor substrate 10 is exposed. Finally, the photoresist layer 43, the bottom anti-reflective coating 42, the low-temperature oxide layer 41, and the amorphous carbon layer 40 may be removed.

After the etching process, a portion of the second dielectric layer 30 and a portion of the first dielectric layer 20 under the mask layer 31a may still remain. That is, two contact holes may be formed during the etching process and the two contact holes may be separated by the remaining portion of the second dielectric layer 30 and the first dielectric layer 20 between the neighboring gate structures 11. In addition, the remaining portion of the second dielectric layer 30 and first dielectric layer 20 may serve as an isolation structure between subsequently-formed metal plugs.

Finally, the contact holes may be filled with a metal material to form metal plugs 204.

Figure 10:
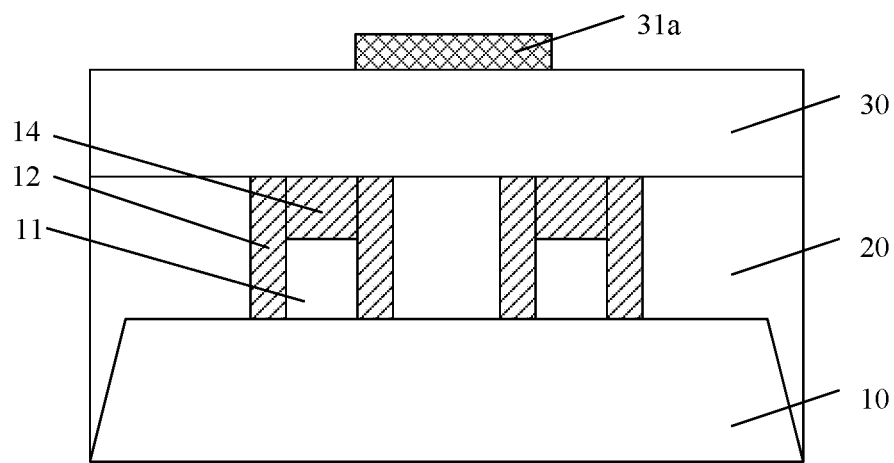
Figure 11:
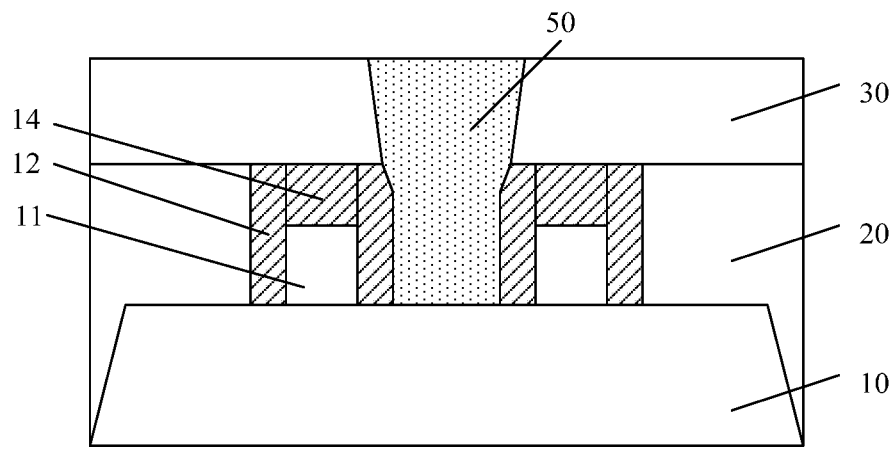

Referring to FIG. 9, a metal plug 50 is formed on each side of the mask layer 31a by filling the corresponding contact hole with a metal material. FIG. 10 shows a cross-section view of the structure shown in FIG. 9 along the AA' line while FIG. 11 shows a cross-section view of the structure along the BB' line.

Referring to FIG. 10, in a region under the mask layer 31a, the portion of the first dielectric layer 20 and the second dielectric layer 30 covered by the mask layer 31a still remain. As a comparison, referring to FIG. 11, in a region not covered by the mask layer 31a, contact holes may be formed by etching through both the second dielectric layer 30 and the first dielectric layer 20 along the opening formed in the photoresist layer 43 (referring to FIG. 8). Further, the metal plugs 50 are subsequently formed in the second dielectric layer 30 and the first dielectric layer 20.

According to the fabrication process described above, the distance from the mask layer 31a (referring to FIG. 7) to surface of the semiconductor substrate 10 may be relatively far, thus during the etching process to form the contact holes, a relatively large thickness of dielectric layers, including both the second dielectric layer 30 and the first dielectric layer 20, may need to be removed by etching. Therefore, the mask layer 31a may be required to have relatively high etching resistance. In the fabrication process, a metal material with high etching resistance is used to form the mask layer 31a. However, using a metal material to form the mask layer 31a may induce metal contamination and, thus, may affect the performance of the formed semiconductor structure. In addition, in one embodiment, because the distance between the mask layer 31a and the semiconductor substrate 10 may be relatively large, during the process to etch the second dielectric layer 30 and the first dielectric layer 20 using the mask layer 31a as the mask, the pattern transferred to the first dielectric layer 20 may deviate from the designed pattern and, thus, the dimension of the contact holes may be different from the desired value. Therefore, the connection performance of the formed metal plugs may be undesired and the performance of the formed semiconductor structure may also be affected.

Figure 28:
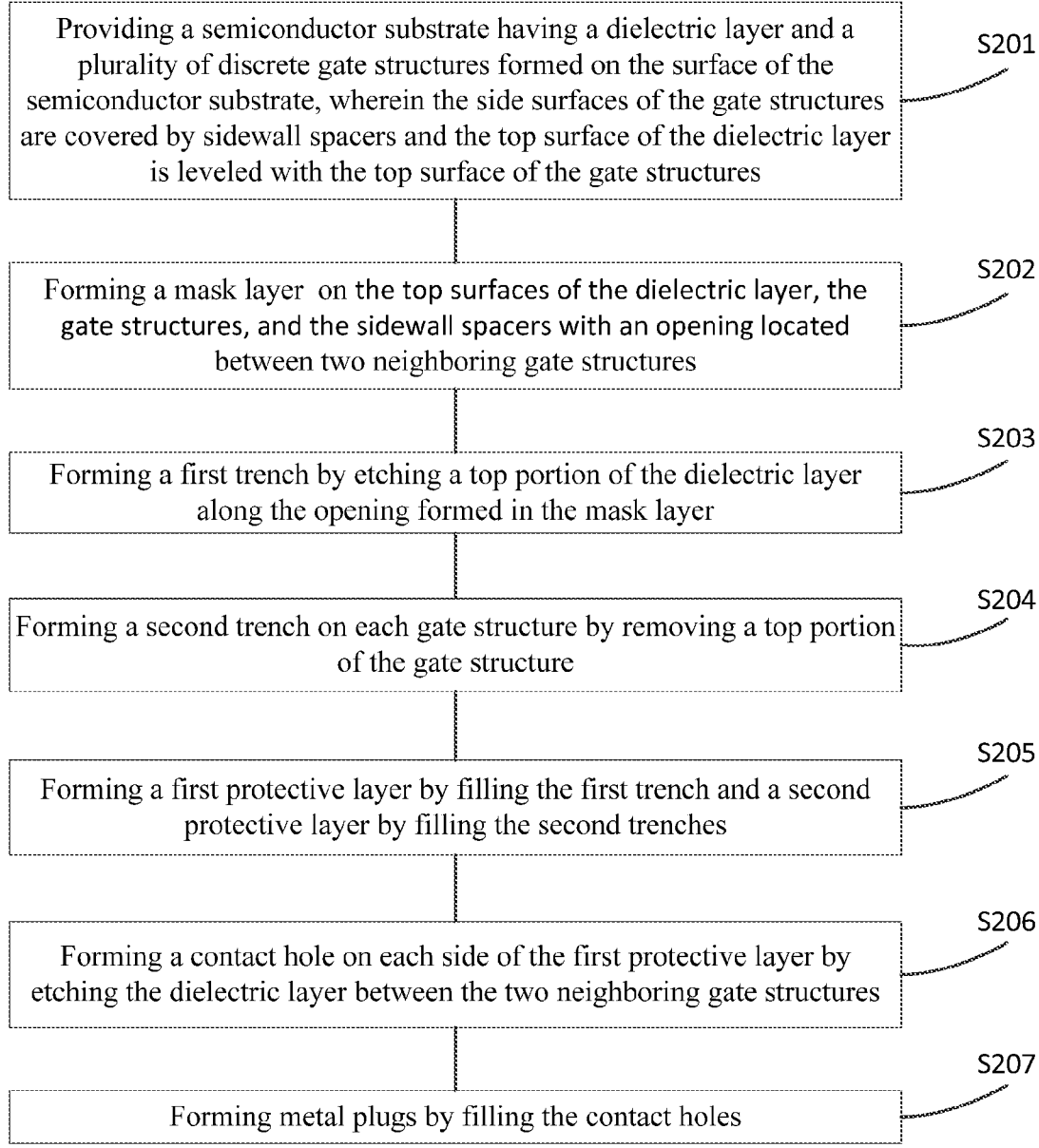
FIG. 28 illustrates a flowchart of the exemplary fabrication process consistent with disclosed embodiments.

The present disclosure also provides a method for fabricating semiconductor structures. Specifically, the method includes additional fabrication steps for forming a first protective layer to cover a portion of the dielectric layer between neighboring gate structures and a second protective layer on the top of each gate structure. The method further includes forming contact holes by etching through the dielectric layer between neighboring gate structures on both sides of the first protective layer to reach the surface of the semiconductor substrate. Finally, the method includes filling the contact holes to form metal plugs. FIG. 28 shows a flowchart of an exemplary fabrication process consistent with disclosed embodiments.

Figure 12:
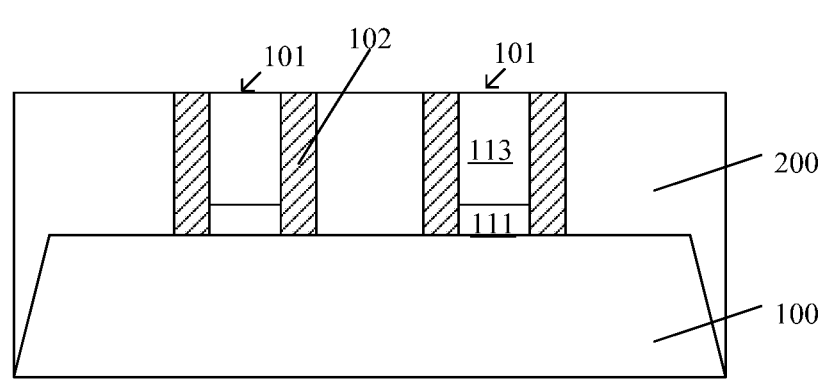
FIGS. 12-27 illustrate schematic views of semiconductor structures corresponding to certain stages of another exemplary fabrication method consistent with disclosed embodiments.

Referring to FIG. 28, at beginning of the fabrication process, a semiconductor substrate is provided (S201). FIG. 12 shows a schematic cross-section view of the semiconductor substrate 100.

The semiconductor substrate 100 may have a plurality of discrete gate structures 101 formed on the surface. In one embodiment, referring to FIG. 12, an exemplary semiconductor substrate 100 having two neighboring gate structures 101 is provided to illustrate the fabrication method. Specifically, in a subsequent process, two self-aligned contact holes may be formed between the two neighboring gate structures. In certain other embodiments, the number of the gate structures 101 may be more than two and correspondingly, the number of the self-aligned contact holes may be more than two.

The gate structures 101 have sidewall spacers 102 formed on the side surfaces of the gate structures 101. A discrete dielectric layer 200 is formed on the surface of the semiconductor substrate 100. Specifically, a portion of the dielectric layer 200 may be formed between the two neighboring gate structures 101. The portion of the dielectric layer 200 formed between the two neighboring gate structures 101 may be separated from other portions of the dielectric layer 200. The surface of the dielectric layer 200 is leveled or coplanar with the surfaces of the gate structures 101.

The semiconductor substrate 100 may be made of any appropriate semiconductor material including Si, Ge, SiGe, GaAs, etc. The semiconductor substrate 100 may be a bulk single material or a composite structure such as silicon on insulator (SOI), etc. In one embodiment, the semiconductor substrate 100 is made of single crystalline silicon.

Further, a plurality of transistors may be pre-formed on the semiconductor substrate 100. The transistors may be planar transistors or fin-FETs. The gate structures 101 are the gate structures of the transistors.

In one embodiment, fin-FETs are formed on the surface of the semiconductor substrate 100. Specifically, the semiconductor substrate 100 includes a base substrate (not shown) and a plurality of fin structures formed on the surface of the base substrate. Each gate structure 101 may cross the fin structures and may cover the side surfaces and the top surfaces of the fin structures. The fin structures may be arranged parallel with each other. A shallow trench isolation (STI) structure may be formed on the surface of the base substrate between two neighboring fin structures. The STI structure may serve as an isolation structure to separate the two neighboring fin structures. The cross-section view shown in FIG. 12 is along the length direction of a fin structure. For illustration purposes, the present disclosure is primarily described based on two neighboring fin structures, self-aligned contact holes may be subsequently formed between the two neighboring gate structures and on the semiconductor substrate 100.

Referring to FIG. 12, each gate structure 101 may include a gate dielectric layer 111 and a gate electrode 113 formed on the surface of the gate dielectric layer 111. In one embodiment, the gate dielectric layer may be made of a high-k dielectric material such as hafnium oxide, zirconia, alumina, hafnium silicon oxide, etc. The gate electrode may be made of a metal such as W, Cu, Al, Au, Pt, Ti, TiN, etc. In certain other embodiments, one or more work function layers may be formed between the gate electrode and the gate dielectric layer.

The sidewall spacers 102 may be used to protect the gate structures 101 during subsequent processes. The sidewall spacers 102 may be made of a semiconductor material such as SiN, SiON, SiC, SiCO, etc. The thickness of the sidewall spacers 102 may be in a range of about 50 Å to about 200 Å, thus the sufficient thickness of the sidewall spacers 102 may provide necessary protection for the gate structures 101.

In one embodiment, a source or drain electrode (not shown) may be formed in the semiconductor substrate 100 on each side of the gate structures 101. Each source or drain electrode formed in the semiconductor substrate 100 is shared by the transistors in the two neighboring gate structures 101.

In one embodiment, after forming the gate structures 101 on the semiconductor substrate 100, the sidewall spacers 102 may then be formed on the side surfaces of the gate structures 101. Further, by using the sidewall spacers 102 and the gate structures 101 as a mask, ions may be implanted into regions in the semiconductor substrate 100 on both sides of the gate structures 101 to form the source/drain electrodes. A dielectric layer 200 may then be formed on the surface of the semiconductor substrate 100. The surface of the dielectric layer 200 may be leveled with the surface of the gate structures 101.

In one embodiment, the dielectric layer 200 may be made of $SiO_x$. The dielectric layer 200 may be formed by an exemplary method including two steps. First, a dielectric material layer may be formed on the surface of the semiconductor substrate 100 by using a chemical vapor deposition (CVD), plasma enhanced CVD, or low pressure CVD process. The surface of the formed dielectric material layer may be higher than the surface of the gate structures 101. Then, a planarization process may be performed on the dielectric material layer to form the dielectric layer 200. The surface of the dielectric layer 200 formed after the planarization process is leveled with the surface of the gate structures 101.

Figure 13:
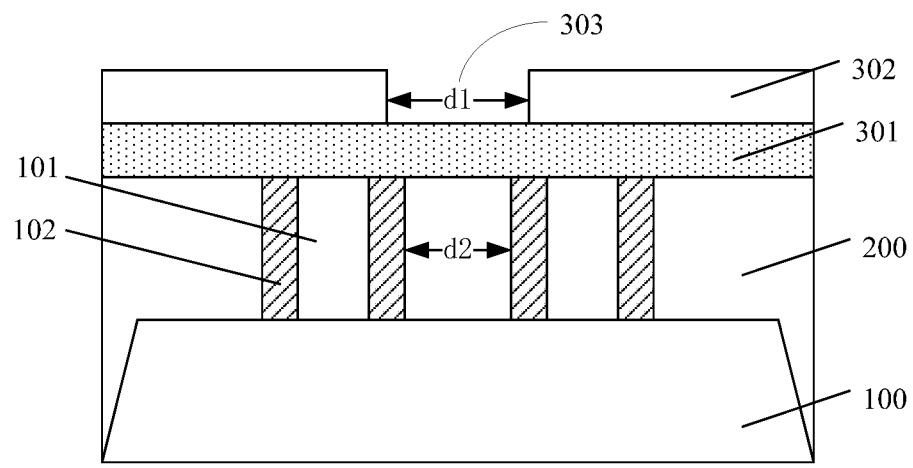

Further, returning to FIG. 28, a mask layer with an opening may be formed on the surfaces of the dielectric layer, the gate structures, and the sidewall spacers (S202). In one embodiment, prior to the formation of the mask layer, a bottom anti-reflective coating may be formed. FIG. 13 shows a structure with a bottom anti-reflective coating 301 formed on the surfaces of the dielectric layer 200, the gate structures 101, and the sidewall spacers 102 and then a mask layer 302 with an opening 303 formed on the bottom anti-reflective coating 301.

Referring to FIG. 13, the width, d1, of the opening 303 may be greater than the width, d2, of the dielectric layer 200 between the neighboring gate structures 101. That is, the opening 303 crosses above the dielectric layer 200 between the neighboring gate structures 101, and the two edges of the opening 303 are located above the sidewall spacers 102.

The bottom anti-reflective coating 301 may be formed by a spin coating method. The bottom anti-reflective coating 301 may be made of an anti-reflective material so that the bottom anti-reflective coating 301 may effectively eliminate standing waves due to light reflection. Therefore, the presence of the bottom anti-reflective coating 301 may increase the range of the exposure energy and improve focusing accuracy during a subsequent photolithography process. The bottom anti-reflective coating 301 may reduce pattern defects caused by dispersion of the reflected light during the photolithography process.

In certain other embodiments, the bottom anti-reflective coating may be optional and may not be formed. That is, the mask layer 302 with the opening 303 may be directly formed on the surfaces of the dielectric layer 200, the gate structures 101, and the sidewall spacers 102.

The mask layer 302 may be made of an appropriate mask material such as $SiN_x$, amorphous silicon, SiCO, SiC, photoresist, etc. In one embodiment, the mask layer 302 is made of a photoresist. Specifically, the mask layer 302 may be formed by a method including: forming a photoresist layer on the surface of the bottom anti-reflective coating 301; performing an exposure and develop process of the photoresist layer to form the mask layer 302 with the opening 303.

As described above, in certain other embodiments, the mask layer 302 with the opening 303 may be directly formed on the surfaces of the dielectric layer 200, the gate structures 101, and the sidewall spacers 102.

Figure 14:
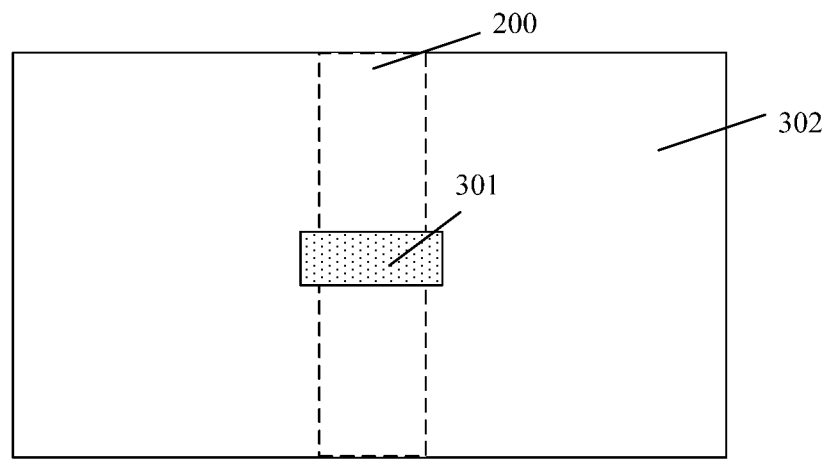

FIG. 14 shows a schematic top-view of the structure shown in FIG. 13 after the formation of the mask layer 302. Referring to FIG. 14, the dashed lines represent the edges of the portion of the dielectric layer 200 between the two neighboring gate structures 101 and under the bottom anti-reflective coating 301. The mask layer 302 exposes the surface of a portion of the bottom anti-reflective coating 301.

Figure 15:
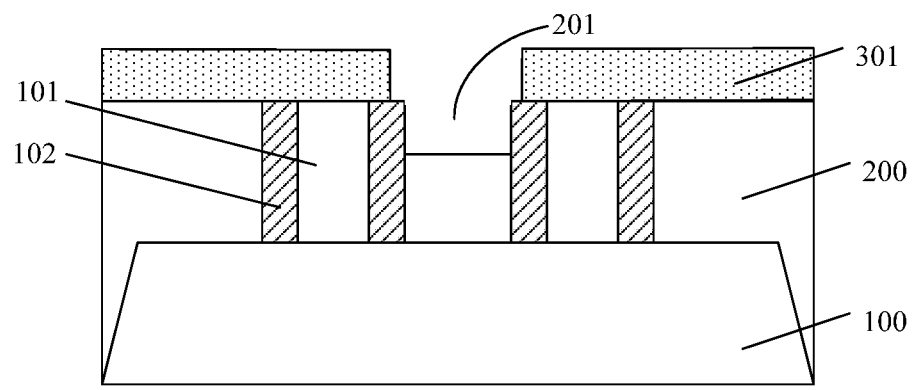

Further, returning to FIG. 28, a portion of the dielectric layer may be etched by using the mask layer as an etch mask to form a first trench (S203). FIG. 15 shows a schematic cross-section view of the structure.

Figure 16:
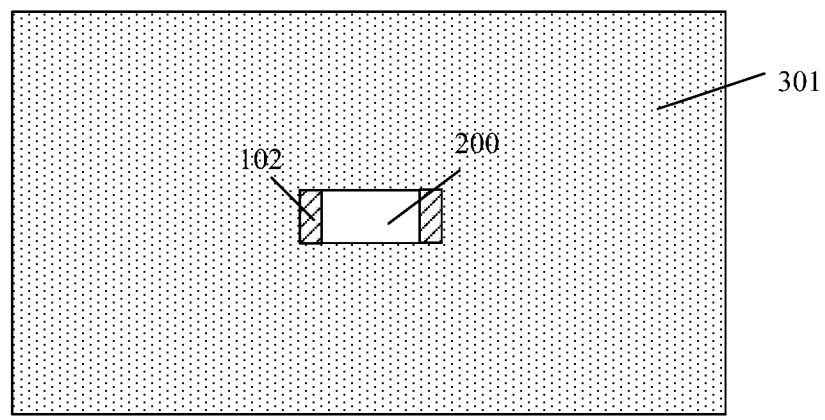

Referring to FIG. 15, a portion of the dielectric layer 200 exposed by the opening formed in the mask layer 302 is removed by etching. A first trench 201 may then be formed in the dielectric layer 200. FIG. 16 shows a schematic top view of the structure after the formation of the first trench 201.

The dielectric layer 200 may be etched by a dry etching process to form the first trench 201. In one embodiment, the bottom anti-reflective coating 301 may be etched along the opening 303 by using the mask layer 302 (referring to FIG. 13) as an etch mask. The etching process exposes a portion of the surface of the dielectric layer 200 and a portion of the surface of the sidewall spacers on both sides of the dielectric layer 200 to form the first trench 201. The dry etching process may be a plasma etching process. In one embodiment, the etching gas is $CF_4$ and the buffer gas is He. The pressure of the etching gas may be in a range of about 20 mTorr to about 200 mTorr. The flow rate of $CF_4$ may be in a range of about 50 sccm and about 1000 sccm while the flow rate of He may be in a range of about 50 sccm to about 1000 sccm. In certain other embodiments, the etching gas may be one or more of fluoride-based gases such as $CF_4$, $CHF_3$, $C_2F_6$, etc.

Because the width d1 (referring to FIG. 13) of the opening 303 is greater than the width d2 (referring to FIG. 13) of the dielectric layer 200 between the neighboring gate structures 101, after etching through the bottom anti-reflective layer 301 along the opening 303, the exposed area includes not only a portion of the surface of the dielectric layer 200 but also a portion of the surface of the sidewall spacers 102 on both sides of the dielectric layer 200. The dielectric layer 200 and the sidewall spacers 102 may be made of different materials so that during the dry etching process, the etching rate on the dielectric layer 200 may be relatively larger than the etching rate on the sidewall spacers 102. Therefore, during the dry etching process to etch the dielectric layer 200, the sidewall spacers 102 may provide protection for the gate structures 101.

Further, the depth of the first trench 201 formed by the dry etching process is smaller than the height of the gate structures 101. That is, a portion of dielectric layer remains between the bottom surface of the first trench 201 and the semiconductor substrate 100. Because the distance between neighboring gate structures is relatively small, when the first trench 201 is too deep, the depth to width ratio of the first trench 201 may be too large, thus during a subsequent process to form a first protective layer in the trench 201, the filling of the first protective layer may become more difficult and as a result, the first protective layer formed in the trench 201 may be porous. In one embodiment, the depth of the first trench 201 may be in a range of about 100 Å to about 700 Å.

Further, in one embodiment, during the process to etch the bottom anti-reflective coating 301 and the dielectric layer 200, the mask layer 302 may be bombarded by the etching plasma, thus the thickness of the mask layer 302 may then be gradually reduced, and eventually, may be completely consumed. In certain other embodiments, after forming the first trench 201, a portion of the mask layer 302 may still remain on the surface of the bottom anti-reflective coating 301. The remaining portion of the mask layer 302 and the bottom anti-reflective coating 301 may be completely removed in a subsequent wet cleaning or ashing process.

Figure 17:
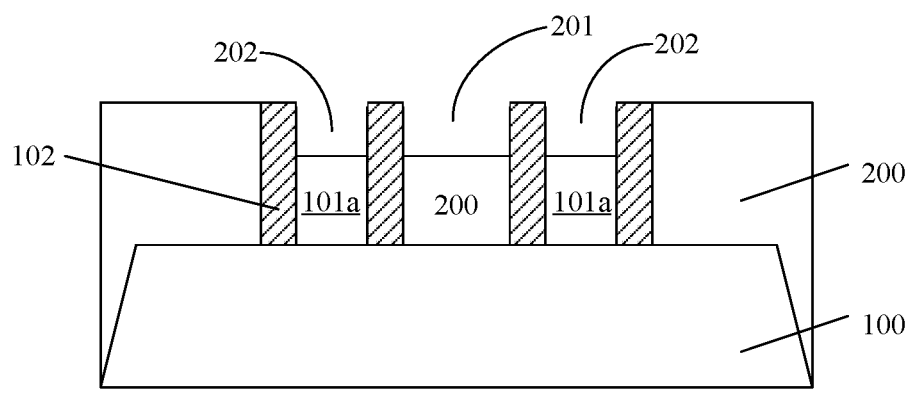
Figure 18:
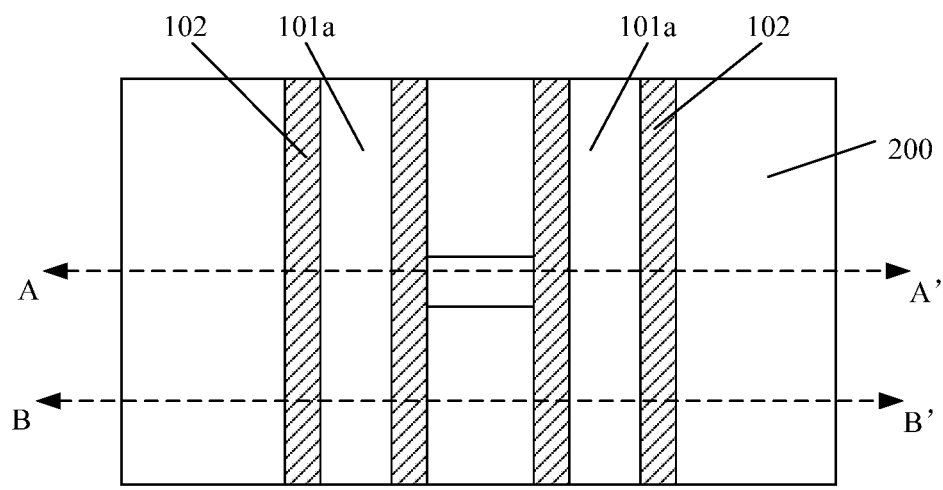

Returning to FIG. 28, further, a portion of the gate structures may be removed by etching (referring to FIG. 15) to form second trenches (S204). FIG. 18 shows a schematic top view of the corresponding semiconductor structure. FIG. 17 shows a cross-section view along the AA' line of the structure shown in FIG. 18.

Referring to FIGS. 17-18, each second trench 202 may run through the entire length of the corresponding etched gate structure 101a, thus the second trench 202 may be longer than the first trench 201 along the length direction of the gate structures 101a.

Figure 19:
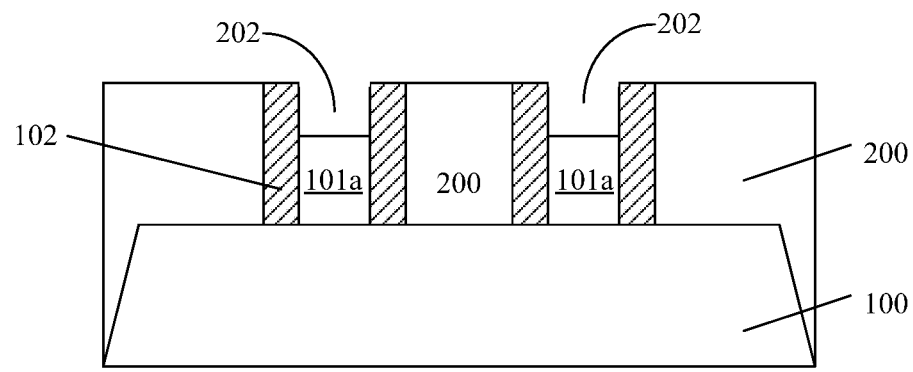

Referring to FIG. 17, the two second trenches 202 may be formed on the top of the two etched gate structures 101a. FIG. 19 shows a schematic cross-section view of the structure shown in FIG. 18 along the BB' line.

Specifically, prior to etching the gate structures 101 (referring to FIG. 15), the bottom anti-reflective coating 301 may be removed by a wet cleaning or an ashing process to expose the surfaces of the dielectric layer 200, the gate structures 101, and the sidewall spacers 102.

Each gate structure 101 may include a dielectric layer and a gate electrode 113 formed on the gate dielectric layer 111. In one embodiment, the etching process is primarily performed on the gate electrode to reduce the height of the gate electrode of the gate structure 101, although any top portion of the gate structure 101, including the gate electrode and/or gate dielectric layer may be removed according to various embodiments of present disclosure.

The gate structure 101 may be etched by a dry etching or a wet etching process. In one embodiment, the gate electrodes are made of W and are etched by a dry etching process. Specifically, the dry etching process may be a plasma etching process using an etching gas including $Cl_2$ and $CF_4$. The flow rate of $Cl_2$ may be in a range of about 10 sccm to about 100 sccm while the flow rate of $CF_4$ may be in a range of about 20 sccm to about 100 sccm. The pressure during the etching process may be kept in a range of about 10 mTorr to about 50 mTorr. The etching gas may have a relatively large etching rate on the material of the gate electrodes and a very limited etching rate on the dielectric layer 200 or on the sidewall spacers 102. Therefore, during the etching process to form the two second trenches 202, the dielectric layer 200 and the sidewall spacers 102 may not be etched or sometimes may be slightly etched.

The surface of the etched gate structures 101a may be lower than the surfaces of the dielectric layer 200 and the sidewall spacers 102 so that the second trenches 202 may be formed on the top of the etched gate structures 101a. Subsequently, a first protective layer may be formed in the first trench 201 and a second protective layer may be formed in each second trench 202 to protect the corresponding etched gate structure 101a during a subsequent process to form contact holes.

The depth of the second trenches 202 may not be very small in order to ensure a substantial thickness for the second protective layers formed in the second trenches 202 so that the second protective layers may provide sufficient protection for the top of the etched gate structures 101a. The depth of the second trenches 202 may not be very large either in order to ensure a sufficient thickness for the gate electrodes in the etched gate structures 101a without affecting the performance of the transistor. In addition, an excessive depth of the second trenches 202 may also lead to undesired large width of the second trenches 202, which further affects the quality of the second protective layers formed in the two second trenches 202. In one embodiment, the depth of the second trenches 202 may be in a range of about 100 Å to about 700 Å so that the subsequently-formed second protective layers in the second trenches 202 may have high quality. In addition, the second protective layers may have a sufficient thickness and, in the meantime, the performance of the transistor may not be affected.

In one embodiment, the depth of the second trenches 202 may be the same as the depth of the first trench 201 so that the depth to width ratio of the first trench 201 is similar to the depth to width ratio of the second trenches 202. Therefore, the subsequently-formed first protective layer in the first trench 201 and the subsequently-formed second protective layers in the two second trenches 202 may have a similar filling quality.

Figure 21:
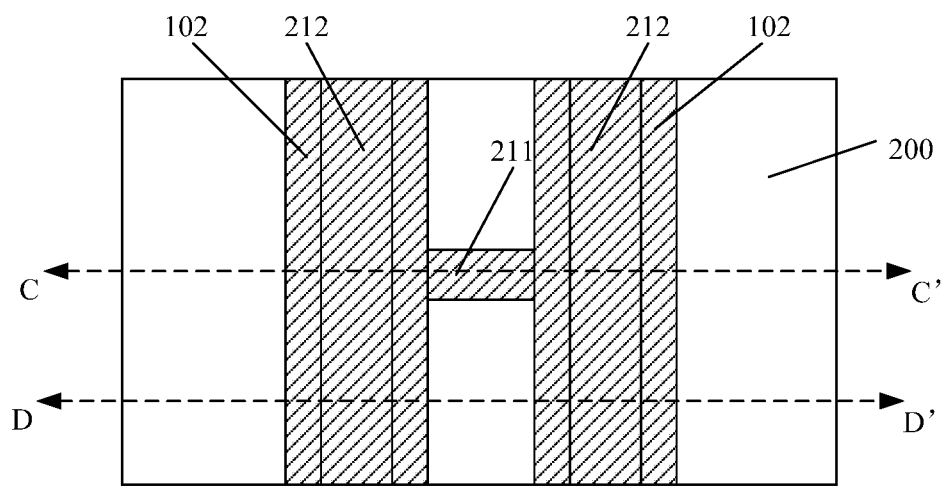

Further, returning to FIG. 28, a first protective layer may be formed by filling the first trench and a second protective layer may be formed by filling each second trench (S205). FIG. 21 shows a schematic top view of a corresponding structure.

Figure 20:
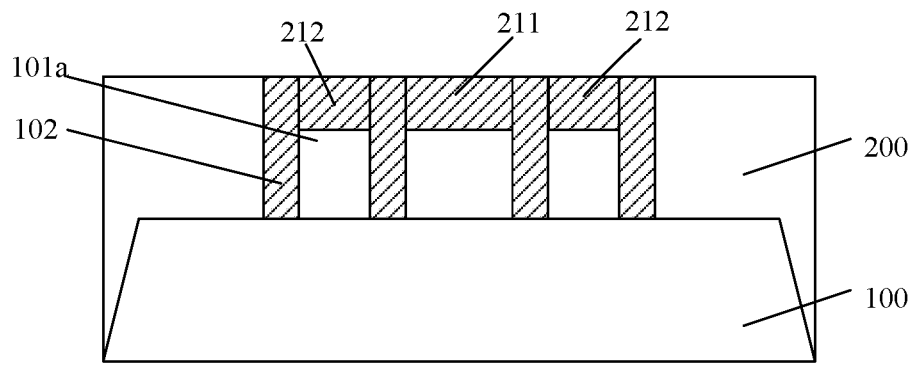
Figure 22:
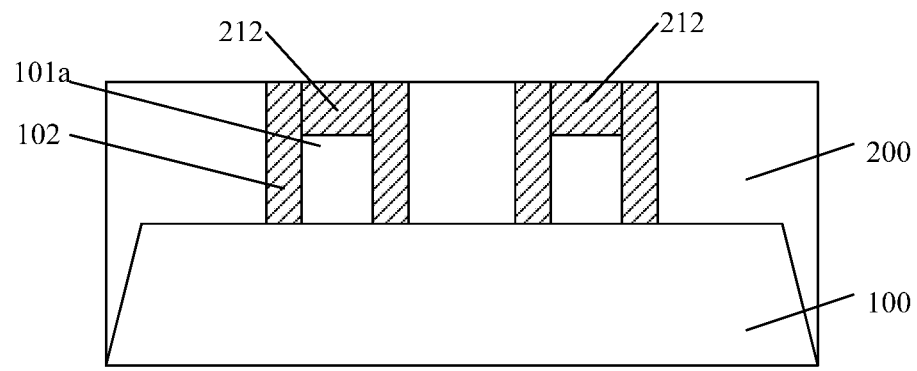

Referring to FIG. 21, the first protective layer 211 is formed to fill the first trench and the second protective layers 212 are formed to fill the second trenches. In addition, the second protective layers 212 may run through the entire length of the etched gate structures 101a, thus may be longer than the first protective layer 211. FIG. 20 shows a cross-section view of the structure shown in FIG. 21 along the CC' line while FIG. 22 shows a cross-section view of the structure shown in FIG. 21 along the DD' line.

The first protective layer 211 and the second protective layers 212 may be formed by a method including: forming a protective material layer to fill the first trench 201 and the second trenches 202 and cover the sidewall spacers 102; further, planarizing the protective material layer by using the dielectric layer 200 as a stop layer to form the first protective layer 211 to fill the first trench 201 and the second protective layers 212 to fill the second trenches 202.

The protective material layer and the dielectric layer 200 may be made of different materials and the ratio of the etching rate on the dielectric layer 200 to the etching rate on the protective material layer may be relatively large. As such, the first protective layer 211 and the two second protective layers 212 formed after the planarization of the protective material layer may not be damaged during a subsequent process for forming contact holes by etching the dielectric layer 200 and thus may provide sufficient protection for the etched gate structures 101a and the portion of dielectric layer 200 under the first protective layer 211 and the two second protective layers 212.

The protective material layer may be made of $SiN_x$, SiON, SiC, SiCO, etc. In one embodiment, the protective material layer is made of $SiN_x$ while the dielectric layer 200 is made of $SiO_x$ so that during a subsequent etching process, the ratio of the etching rates on the two materials is relatively large.

The protective material layer may be planarized by a dry etching process or a chemical mechanical polishing (CMP) process. In addition, the surface of the dielectric layer 200 may be used as a stop layer of the planarization process. By performing the planarization process, the first protective layer 211 in the first trench 201 and the second protective layers 212 in the second trenches 202 may be formed by removing a portion of the protective material layer located on the surfaces of the dielectric layer 200 and the sidewall spacers 102. The surfaces of the first protective layer 211 and the second protective layers 212 may be leveled with the surface of the dielectric layer 200.

The thickness of the first protective layer 211 is the same as the depth of the first trench 201. That is the thickness of the first protective layer 211 may be in a range of about 100 Å to about 700 Å. The thickness of the second protective layers 212 is the same as the depth of the second trenches 202. That is the thickness of the second protective layers 212 may also be in a range of about 100 Å to about 700 Å. The first protective layer 211 and the second protective layers 212 may have a sufficient thickness to provide desired protection for the dielectric layer 200 and the etched gate structures 101a located under the first protective layer 211 and the second protective layers 212.

Figure 24:
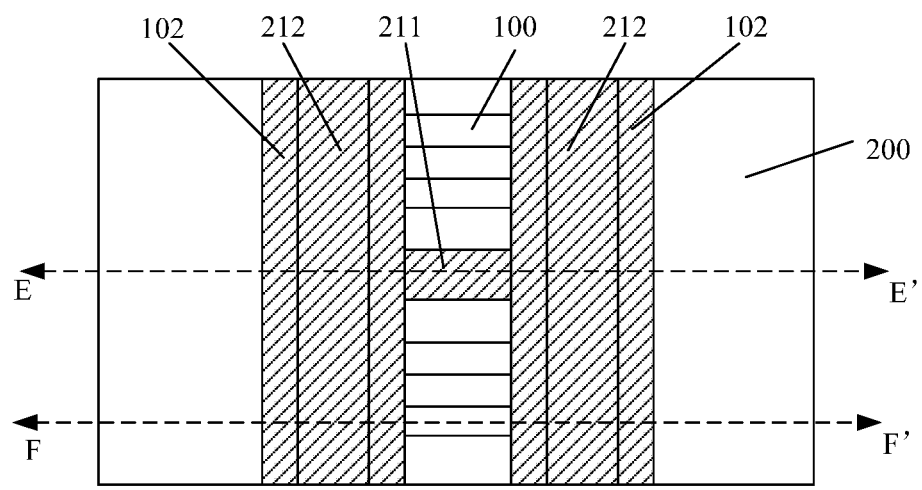

Further, returning to FIG. 28, contact holes may be formed by etching the dielectric layer between the two neighboring gate structures on both sides of the first protective layer (S206). FIG. 24 shows a schematic top view of a corresponding structure. Referring to FIG. 24, the surface of the semiconductor substrate 100 may be exposed after etching the dielectric layer 200 between the two neighboring etched gate structures 101a. In one embodiment, because fin structures are formed on the semiconductor substrate 100, the surfaces of the fin structures may also be exposed in the contact holes 203.

Figure 23:
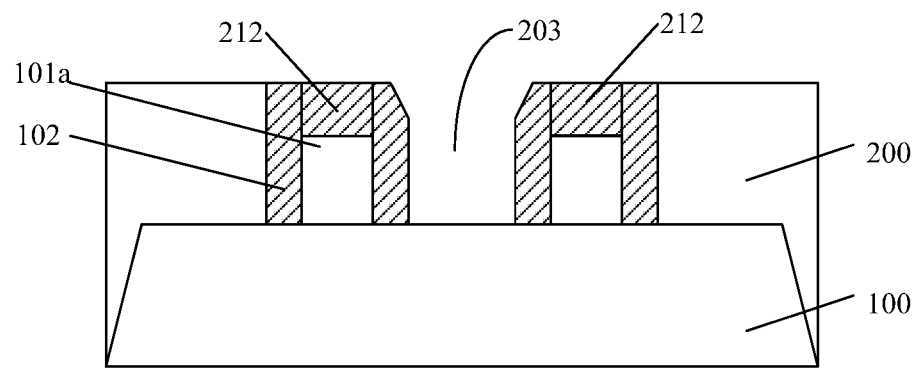

FIG. 23 shows a schematic cross-section view of the structure shown in FIG. 24 along the FF' line while FIG. 24 shows a schematic cross-section view of the structure shown in FIG. 24 along the EE' line.

A dry etching process may be adopted to etch the dielectric layer 200. The dry etching process may be a plasma etching process. In one embodiment, the etching gas is $CF_4$ and the buffer gas is He. The pressure of the etching gas may be in a range of about 20 mTorr to about 200 mTorr. The flow rate of $CF_4$ may be in a range of about 50 sccm to about 1000 sccm while the flow rate of He may be in a range of 50 sccm to about 1000 sccm. In certain other embodiments, the etching gas may be one or more of fluoride-based gases such as $CF_4$, $CHF_3$, $C_2F_6$, etc.

Figure 25:
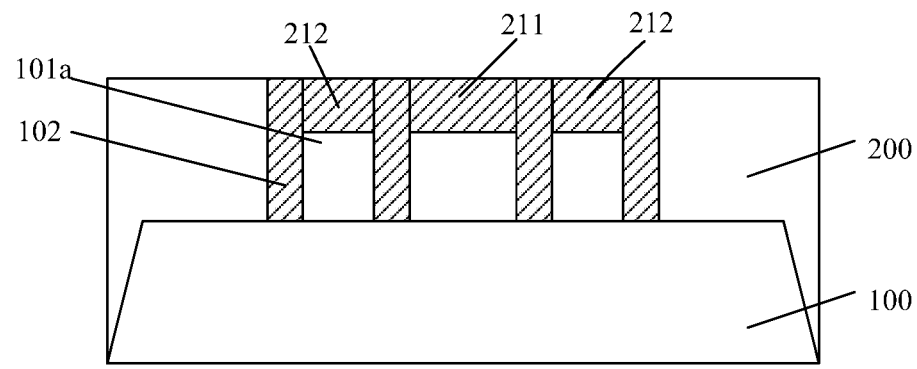

Referring to FIG. 25, the dry etching process has a relatively high etching rate on the dielectric layer 200 while a very low etching rate on the first protective layer 211, the second protective layers 212, and the sidewall spacers 102, thus during the etching process, the second protective layers 212 and the sidewall spacers 102 may protect the etched gate structures 101a while the first protective layer 211 may protect the portion of the dielectric layer 200 under the first protective layer 211. Therefore, the contact holes 203 may be formed on the two sides of the first protective layer 211. That is, the two contact holes 203 formed by the etching process may be separated by the first protective layer 211 and the portion of the dielectric layer 200 under the first protective layer 211.

During the etching process, despite a relatively low etching rate, the sidewall spacers 102 may be, to some degree, damaged because of the relatively long etching time due to the large thickness of the dielectric layer 200 being etched. Specifically, damages to the top of the sidewall spacers 102 may be more evident. In one embodiment, the thickness of the sidewall spacers 102 may be in a range of about 50 Å to about 200 Å. With such a thickness, the sidewall spacers 102 may be able to resist such damage and thus provide desired protection for the etched gate structures 101a.

In one embodiment, prior to etching the dielectric layer 200 to form the contact holes, a patterned mask layer may be formed on the top of the dielectric layer 200, the sidewall spacers 102, and the second protective layers 212. The patterned mask layer may expose the first protective layer 211 and the dielectric layer 200 between neighboring etched gate structures 101a. Further, the portion of the dielectric layer 200 between neighboring etched gate structures 101a on the two sides of the first protective layer may be etched by using the patterned mask layer as an etch mask. Therefore, etching undesired portion of the dielectric layer 200 at other locations on the semiconductor substrate 100 may be avoided. The patterned mask layer may be made of photoresist. After forming the contact holes, the patterned mask layer may be removed by an ashing or a wet etching process.

Figure 26:
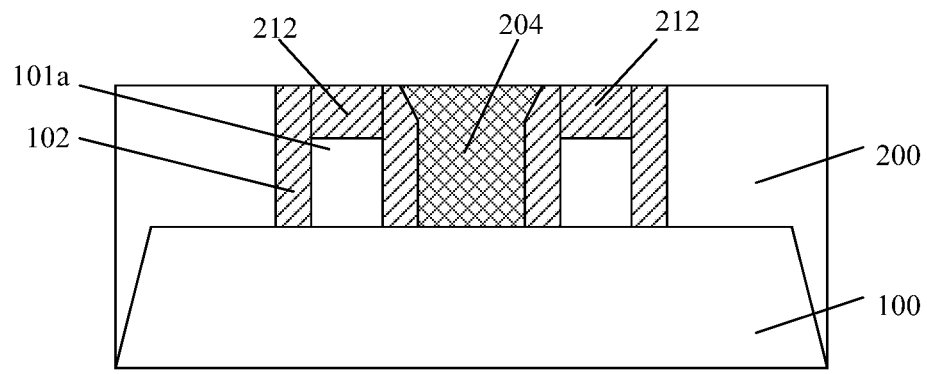
Figure 27:
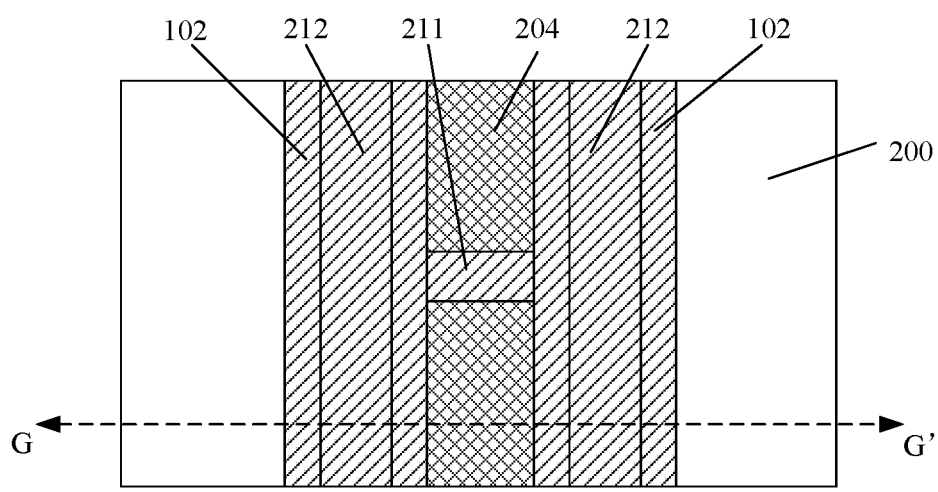

Further, returning to FIG. 28, metal plugs may be formed by filling the contact holes (S207). FIG. 27 shows a schematic top view of a corresponding structure. Referring to FIG. 27, the metal plugs 204 may be formed in the contact holes on both sides of the first protective layer 211 and cover the fin structures and the surface of the semiconductor substrate. FIG. 26 shows a schematic cross-section view of the structure shown in FIG. 27 along the GG' line.

The metal plugs 204 may be formed by a method including: forming a metal material layer to fill the contact holes 203 and cover the dielectric layer 200, the first protective layer 211, the second protective layers 212, and the sidewall spacers 102; then, forming the metal plugs 204 in the contact holes 203 by planarizing the metal material layer until the surface of the first protective layer 211 is exposed.

The metal material layer may be made of any appropriate metal(s) including W, Al, Cu, Ag, Au, etc. In one embodiment, the metal material layer is made of W. The metal material layer may be formed by a CVD, a sputtering, or an electroplating process.

Because the metal material layer fills the contact holes 203 and covers the first protective layer 211, the metal material layer is a continuous layer before the subsequent planarization process. In the subsequent planarization process, the metal material layer may be polished or etched to expose the surface of the first protective layer 211. That is, the portion of the metal material on the top of the dielectric layer 200, the second protective layers 212, the first protective layer 211, and the sidewall spacers 102 may be removed. Therefore, the metal material layer may be disconnected after the planarization process and form two metal plugs 204 located separately on the two sides of the first protective layer 211.

In certain other embodiments, the stop position for planarizing the metal material layer may be lower than the surface of the first protective layer 211 to ensure complete disconnection between the two metal plugs 204 on the two opposite sides of the first protective layer 211. That is, after the surface of the first protective layer 211 is exposed, the planarization process continues until a certain thickness of the protective layer 211 is removed by polishing. In one embodiment, the planarization process may be stopped at a position about 50 Å to about 100 Å lower than the surface of the first protective layer 211 to ensure complete disconnection between the two metal plugs 204 on the two opposite sides of the first protective layer 211.

The present disclosure also provides a semiconductor structure. The semiconductor structure includes a semiconductor substrate 100. The semiconductor substrate 100 may include a base substrate and a plurality of fin structures formed on the base substrate.

A plurality of discrete gate structures 101a may be formed on a top surface of the semiconductor substrate 100. A plurality of sidewall spacers 102 may be formed on side surfaces of the gate structures 101a. A top surface of the sidewall spacers 102 may be higher than a top surface of the gate structures 101a. A dielectric layer 200 may also be formed on the top surface of the semiconductor substrate 100.

A first protective layer 211 may be formed on a discrete portion of the dielectric layer 200 between two neighboring electrode structures 101a. A top surface of the portion of the dielectric layer 200 covered by the first protective layer 211 may be lower than a top surface of the sidewall spacers 102. A top surface of another portion of the dielectric layer 200 and a top surface of the first protective layer 211 may both be leveled with the top surface of the sidewall spacers 102.

A discrete second protective layer 212 may be formed on top of the gate structures 101a. A top surface of the second protective layer 212 may be leveled with the top surface of the sidewall spacers 102. The semiconductor substrate 100 may further include a base substrate and a plurality of fin structures formed on the base substrate.

Two metal plugs 204 may be formed between a pair of neighboring gate structures 101a. A top surface of the metal plugs may be leveled with the top surfaces of the sidewall spacers 102, the portion of dielectric layer 200 not covered by the first protective layer 211, the first protective layer 211, and/or the second protective layer 212. Further, the two metal plugs 204 may be separated by the corresponding first protective layer 211 and the portion of the dielectric layer 200 under the first protective layer 211. A dimension of each metal plug 204 may slightly increase in a region near the top surface, as approaching to the top surface. The metal plugs 204 may be formed in contact with the surface of the base substrate and the top and the side surfaces of the fin structures formed on the base substrate.

According to the disclosed fabrication method, the fabrication process includes providing a semiconductor substrate; forming a plurality of discrete gate structures on the semiconductor substrate with a plurality of sidewalls covering the side surfaces of the gate structures; forming a dielectric layer on the surface of the semiconductor substrate with a top surface of the dielectric layer leveled with the top surface of the gate structures; forming a mask layer with an opening on the top of the dielectric layer, the gate structures, and the sidewalls; etching the dielectric layer using the mask layer as a mask to form a first trench and then removing the mask layer; then, etching the gate structures to form second protective layers; further, forming contact holes by etching through a portion of the dielectric layer on both sides of the first protective layer between neighboring gate structures to reach the surface of the semiconductor substrate.

Compared to conventional methods, the disclosed method introduces a first protective layer on a portion of the dielectric layer between neighboring gate electrodes. Specifically, the first protective layer is directly formed on the portion of the dielectric layer.

During the subsequent process to form the contact holes by etching the dielectric layer, the first protective layer may provide protection for the portion of the dielectric layer under the first protective layer. Therefore, the portion of the dielectric layer may survive and serve as an isolation structure between the formed contact holes. In the meantime, the second protective layers may provide protection for the sidewalls and the gate structures.

In addition, during the process to form the first trench by etching the dielectric layer using the mask layer as the etch mask, the distance between the mask layer and the dielectric layer may be relatively small, allowing the pattern of the opening in the mask layer be precisely transferred into the dielectric layer. Therefore, the accuracy of the dimension of the contact holes may be improved and, thus, the performance of the formed semiconductor structure may also be improved.

Further, the disclosed method avoids using a mask layer made of a metal material as a mask for etching the dielectric layer to form contact holes, thus metal contamination may be eliminated. Therefore, the performance of the formed semiconductor structure may not be affected.

Further, the depth of the first trench may be in a range of about 100 Å to about 700 Å. Because the distance between neighboring gate structures is relatively small, when the first trench is too deep, the depth to width ratio of the first trench may be too large, thus during a subsequent process to form a first protective layer in the first trench, the filling of the first protective layer may become more difficult and as a result, the first protective layer formed in the first trench may be porous. Therefore, with the depth of the first trench in a range of about 100 Å to about 700 Å. Because, an excessively large depth to width ratio of the first trench may be avoided and, thus, the quality of the first protective layer formed in the first trench may be improved.

Further, the depth of the second trenches may also be in a range of about 100 Å to about 700 Å. The depth of the second trenches may not be very small in order to ensure a substantial thickness for the second protective layers formed in the second trenches so that the second protective layers may provide sufficient protection for the top of the etched gate structures. The depth of the second trenches may not be very large in order to ensure a sufficient thickness for the gate electrodes in the etched gate structures without affecting the performance of the transistor. In addition, an excessive depth of the second trenches may also lead to undesired large width of the second trenches thus further affect the quality of the second protective layers formed in the second trenches. With the depth of the second trenches in a range of about 100 Å to about 700 Å, the subsequently-formed second protective layers in the second trenches may have high quality. In addition, the second protective layers may have a sufficient thickness and, in the meantime, the performance of the transistor may not be affected.

Further, the metal plugs may be formed in the contact holes through a method including: forming a metal material layer to fill the contact holes and cover the dielectric layer, the first protective layer, the second protective layers, and the sidewalls; then, forming the metal plugs in the contact holes by planarizing the metal material layer until the surface of the first protective layer is exposed. During a subsequent planarization process, the portion of the metal material on the top of the dielectric layer, the second protective layers, the first protective layer, and the sidewalls may be removed to form two independent metal plugs. The two metal plugs may be disconnected and separated from each other by the first protective layer. Therefore, undesired performance of the formed semiconductor structure due to electric connection between the two metal plugs may be avoided.

The planarization process may be stopped at a position about 50 Å to about 100 Å lower than the surface of the first protective layer to ensure complete disconnection between the two metal plugs on the two opposite sides of the first protective layer.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
    forming a dielectric layer, a plurality of discrete gate structures, and a plurality of sidewall spacers on a semiconductor substrate, wherein the plurality of discrete gate structures and the sidewall spacers are formed in the dielectric layer, and one sidewall spacer is formed on each side of each gate structure;
    removing a top portion of the dielectric layer between neighboring sidewall spacers of neighboring gate structures, wherein the top portion of the dielectric layer is located corresponding to a portion of a length of the neighboring sidewall spacers;
    removing a top portion of each gate structure;
    forming a protective layer on each of a remaining dielectric layer and a remaining gate structure;
    after forming the protective layer, forming contact holes on the semiconductor substrate, between neighboring sidewall spacers, and on opposite sides of the protective layer on the remaining dielectric layer; and
    forming a metal plug in each contact hole.

2. The method for fabricating the semiconductor structure according to claim 1, wherein:
    the step of removing the top portion of the dielectric layer includes:
        forming a mask layer over the dielectric layer, the gate structures, and the sidewall spacers,
        wherein the mask layer includes an opening across above the top portion of the dielectric layer between the neighboring gate structures, the opening exposing a portion of each of the neighboring sidewall spacers,
        forming a first trench by etching the top portion of the dielectric layer along the opening in the mask layer, and removing the mask layer; and
    the step of removing the top portion of each gate structure includes:
        forming a second trench on each gate structure by removing the top portion of each gate structure.

3. The method for fabricating the semiconductor structure according to claim 2, wherein the step of forming the protective layer on each of the remaining dielectric layer and the remaining gate structure includes:
    forming a protective material layer to fill the first trench and the second trench and to cover the dielectric layer and the sidewall spacers, and
    forming a first protective layer to fill the first trench and a second protective layer to fill the second trench by performing a planarization process on the protective material layer using the dielectric layer as a stop layer.

4. The method for fabricating the semiconductor structure according to claim 3, wherein the step of forming the contact holes includes:
    forming a patterned mask layer on the remaining dielectric layer, the sidewall spacers, and the second protective layer to expose the first protective layer and the remaining dielectric layer between the neighboring gate structures, and
    using the patterned mask layer as an etch mask to etch a portion of the remaining dielectric layer between the neighboring sidewall spacers of the neighboring gate structures and on the opposite sides of the first protective layer.

5. The method for fabricating the semiconductor structure according to claim 2, wherein:
    the first trench and the second trench have a same depth.

6. The method for fabricating the semiconductor structure according to claim 1, wherein:
    the dielectric layer, the gate structures, and the sidewall spacers have a coplanar top surface.

7. The method for fabricating the semiconductor structure according to claim 1, wherein:
    the protective layer is made of a material including $SiN_x$, SiON, SiC, SiCO, or a combination thereof, and
    the protective layer has a thickness in a range of about 100 Å to about 700 Å.

8. The method for fabricating the semiconductor structure according to claim 1, wherein:
    the sidewall spacers are made of a material including $SiN_x$, SiON, SiC, SiCO, or a combination thereof, and
    the sidewall spacers has a thickness is in a range of about 50 Å to about 200 Å.

9. The method for fabricating the semiconductor structure according to claim 1, further including:
    forming a bottom anti-reflective coating on the dielectric layer, the gate structures, and the sidewall spacers, prior to removing the top portion of the dielectric layer.

10. The method for fabricating the semiconductor structure according to claim 1, wherein removing the top portion of each gate structure includes:
    a dry etching process or a wet etching process.

11. The method for fabricating the semiconductor structure according to claim 1, wherein:
    removing the top portion of the dielectric layer includes a dry etching process.

12. The method for fabricating the semiconductor structure according to claim 1, wherein:
    the semiconductor substrate includes a base substrate and a plurality of fin structures formed on the base substrate, and
    the plurality of discrete gate structures cross the plurality of fin structures to cover side surfaces and top surfaces of the plurality of fin structures.

13. The method for fabricating the semiconductor structure according to claim 1, wherein:
    the gate structure includes a gate dielectric layer made of a material including hafnium oxide, zirconia, alumina, hafnium silicon oxide, or a combination thereof, and
    the gate structure includes a gate electrode made of a material including W, Cu, Al, Au, Pt, Ti, TiN, or a combination thereof.

14. The method for fabricating the semiconductor structure according to claim 1, wherein forming the metal plug includes:
    forming a metal material layer to fill each contact hole and to cover the remaining dielectric layer, the protective layer, and the sidewall spacers, and
    performing a planarization process on the metal material layer until a surface of the protective layer is exposed.

15. The method for fabricating the semiconductor structure according to claim 14, further including:

overly polishing the metal material layer in the planarization process, such that the metal material layer in each contact hole has a surface lower than the surface of the protective layer.

16. The method for fabricating the semiconductor structure according to claim 15, wherein:
the surface of the metal material layer in each contact hole after the planarization process is about 50 Å to about 100 Å lower than the surface of the protective layer.

17. The method for fabricating the semiconductor structure according to claim 1, wherein:
removing the top portion of each gate structure includes removing a portion of a gate electrode of each gate structure.

* * * * *